United States Patent [19]

Falk

[11] Patent Number: 5,024,499

[45] Date of Patent: Jun. 18, 1991

[54] OPTICAL AND GATE FOR USE IN A CROSS-BAR ARITHMETIC/LOGIC UNIT

[75] Inventor: R. A. Falk, Renton, Wash.

[73] Assignee: The Boeing Company, Seattle, Wash.

[21] Appl. No.: 414,475

[22] Filed: Sep. 29, 1989

[51] Int. Cl.[5] .................. G02B 6/12; H03K 17/80; G06E 1/04

[52] U.S. Cl. .................. 350/96.11; 350/96.14; 350/96.16; 350/96.18; 364/712; 364/713; 364/715.01; 307/407; 307/409

[58] Field of Search .............. 350/96.11, 96.12, 96.13, 350/96.14, 96.10, 96.15, 96.16, 320, 96.18; 364/713, 715.01, 712, 822, 900, 807; 365/64, 76, 78; 307/407, 409; 250/213 A

[56] References Cited

U.S. PATENT DOCUMENTS

| | | | |
|---|---|---|---|
| 4,113,353 | 9/1978 | Matsushita | 350/96.15 |
| 4,592,004 | 5/1986 | Bocker et al. | 364/713 |
| 4,620,293 | 10/1986 | Schlunt et al. | 364/713 |
| 4,764,890 | 8/1988 | Hinton | 364/713 |
| 4,809,204 | 2/1989 | Dagenais et al. | 364/713 |
| 4,939,682 | 7/1990 | Falk | 364/713 |
| 4,964,687 | 10/1990 | Falk | 350/96.13 |

OTHER PUBLICATIONS

Szabo, Nicholas S., M.S. et al., "Residue Arithmetic and Its Applications to Computer Technology", McGraw-Hill Book Company, New York, 1977, pp. 105-133.

Carter, G. M. et al., "Intensity-Dependent Index of Refraction in Multilayers of Polydiacetylene", Appl. Phys. Lett. 43 (10), Nov. 15, 1983, pp. 891-893.

Carter, G. M. et al., "Intensity Dependent Index of Refraction in Organic Materials", Optical Engineering, Jul./Aug. 1985, vol. 24, No. 4, pp. 609-612.

*Primary Examiner*—Brian Healy

*Attorney, Agent, or Firm*—Foley & Lardner

[57] ABSTRACT

An optical AND gate for use in a cross-bar arithmetic/-logic unit including first and second optical substrates which are configured adjacent to one another with each of the optical substrates having a respective plurality of optical paths formed thereon. The pattern of optical paths form a plurality of intersecting regions where the optical paths associated with one of the optical substrates overlaps the optical paths associated with the other optical substrate. The optical substrates are operable for transmitting an incident light beam there through so as to produce an output at one of the intersecting regions. The optical substrates transmit the incident light beam only through the optical paths which have been illuminated by a plurality of light sources.

17 Claims, 8 Drawing Sheets

| $X_2$ \ $X_1$ | 0 | 1 |
|---|---|---|
| 0 | 0 | 1 |
| 1 | 1 | 0 |

| $X_2$ \ $X_1$ | 0 | 1 | 2 |
|---|---|---|---|
| 0 | 0 | 1 | 2 |
| 1 | 1 | 2 | 0 |
| 2 | 2 | 0 | 1 |

OPTICAL AND GATE FOR USE IN A CROSS-BAR ARITHMETIC/LOGIC UNIT

BACKGROUND OF THE INVENTION

This invention relates generally to optical information processing and, in particular, to an integrated electro-optical cross-bar apparatus for performing parallel optical logic and arithmetic operations.

There is a fundamental difference between optical circuits, in which the information carriers are photons, and electronic circuits, where the carriers are electrons. In the former case the carriers do not interact with each other, while in the latter they do. This means that in optical devices there exist interconnect possibilities that do not exist with electronic hardware, in particular, interconnected parallel architectures which permit digital arithmetic and logic operations to be performed in a completely parallel, single step process. After the inputs are switched on, the output appears in the time it takes a photon to transit the device. No faster computation time is possible.

Several recent patent applications have described techniques for optically performing logic and residue arithmetic in a single logical step. These applications include co-pending application Ser. No. 019,761 filed Feb. 27, 1987 by Falk et al, pending, and co-pending application Ser. No. 219,276 filed July 15, 1988, now U.S. Pat. No. 4,939,682, by Falk et al, both applications are incorporated herein by reference. The final logical step described therein was a parallel set of threshold logic devices. For the cross-bar structure, the threshold devices distinguish between light intensity levels of the 0 or 1 units and a light intensity level of 2 units. The threshold device essentially performs an AND function.

Ser. No. 019,761 describes an optical cross-bar arithmetic/logic unit that performs the above mentioned single step process by employing residue arithmetic. Residue arithmetic does not have a "carry" operation; that is, each "bit" in the representation is independent of the other. In residue arithmetic, each "bit" in a representation of a number is the decimal value of the number modulo the prime number corresponding to that position, called the "modulus" or the "radix".

The optical cross-bar arithmetic/logic disclosed in the above mentioned co-pending application utilizes cross optical paths of light which are configured to define intersecting regions with each other corresponding to truth table or logic table inputs. The intensity of light at each intersecting region is directed to determine if 2 units of light intensity are present at each intersection, thereby indicating a particular logic state.

In co-pending application Ser. No. 219,276, filed July 15, 1988 by R. Aaron Falk, there is disclosed a device to maximizing the performance and reducing the size of the optical cross-bar arithmetic/logic unit by forming the wave guide and electronic detectors of an optical cross-bar arithmetic/logic unit together in a single integrated electro-optic chip.

SUMMARY OF THE INVENTION

Accordingly, it is an object of the present invention to provide an all optical AND gate and the utilization of this gate in the cross-bar architecture to perform logic and residue arithmetic.

It is a further object of the present invention to provide an improved AND gate that can decrease the required response time when using optics in arithmetic and logic operations.

In accordance with the present invention, two optical substrates are configured adjacent to one another in tandem. Each of the optical substrates has associated therewith a plurality of optical paths which are illuminated by a plurality of light sources associated with each of the optical substrates. The optical paths on each of the optical substrates are formed in a horizontal pattern and a vertical pattern, respectively, such that a plurality of intersecting sections wherein an optical path of one of the optical substrates overlaps an optical path on the other optical substrate. The tandem optical substrates are operable for transmitting an incident light beam through at least one of the plurality of optical paths associated with each of the optical substrates which is illuminated by the light sources. An output occurs at the intersecting region of the illuminated optical paths on each of the optical substrates. Thus, the device operates as an optical AND gate requiring all inputs to be high in order to produce an output.

DETAILED DESCRIPTION OF THE PREFERRED EMBODIMENTS

Figure 1:
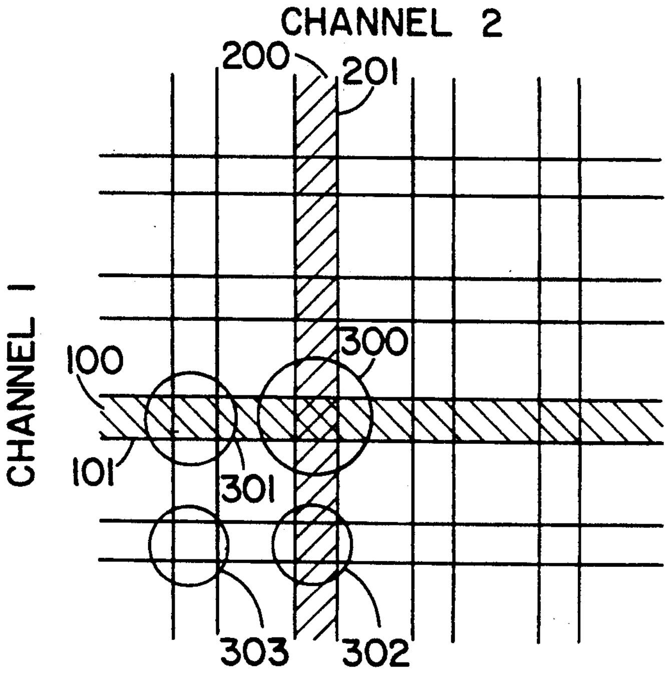
FIG. 1 is a schematic drawing showing the basic concept of an optical cross-bar arithmetic/logic unit.

Referring now to FIG. 1, the basic concept of the optical cross-bar arithmetic/logic unit (ALU) as described in co-pending application Ser. No. 019,761 is shown using a 4×4 ALU. Input 100 from channel 1 and input 200 from channel 2 transmit light in optical paths 101 and 201 respectively to intersect at a region designated by reference number 300. Inputs 100 and 200 may comprise light sources coupled directly or indirectly to the optical paths 101 and 201 respectively. Thus, the level of light intensity at intersection region 300 is equivalent to two units of light. In comparison, the level of light intensity detected at intersecting regions 301 and 302 is only one unit of light, and the level of light intensity detected at intersecting region 303 is zero.

Figures 2A, 2B:
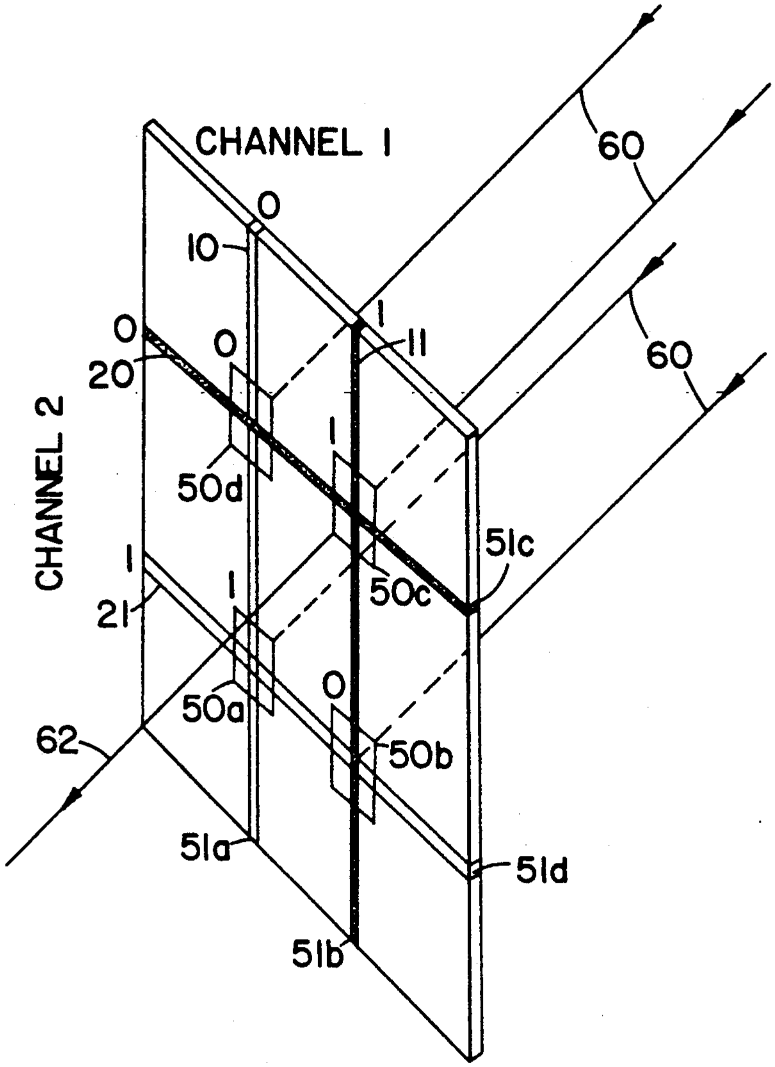
FIGS. 2*a* and 2*b* show a schematic representation of an exclusive-OR operation according to the technique of the optical cross-bar arithmetic/logic unit and the associated truth table that can be achieved by the device, respectively.

FIG. 2*a* shows an integrated optical wave guide example of an exclusive-OR gate. In this form, optical wave guides 51*a*–51*d* define optical paths 10, 11, 20 and 21 respectively, and are made to intersect at optical bistable devices 50a–50d as shown. The optical bistable devices 50a–50d are non-linear devices which can perform an AND operation, i.e., they only turn on when two light inputs are present. In the example shown, the bistable device 50c permits the transmission of light, indicated by arrows 62, from a sampling beam designated by arrows 60 only when an intersecting region of the device 50c has two units of light crossing. For the example shown, this will only occur where path 11 intersects path 20. Equivalent outputs, such as those found at bistable devices 50a and 50c, can be optically combined at this point using standard optical techniques. Of course, other integrated optics packages are clearly possible, including types that are similar to the fiber optics version shown in FIG. 4 of Ser. No. 019,761, i.e. detector/threshold means are used for the AND operation. Furthermore, the improved packaging and increased speed (due to decreased size) of an integrated optics design are readily apparent. The table of FIG. 2b shows an example of the level logic table associated with standard Boolean algebra of such an exclusive-OR device. This table is a representative example only as it is apparent that all possible multi-level logic tables can be constructed in a similar fashion as is discussed by Szabo and Tanaka in *Residue Arithmetic and its Applications to Computer Technology*, McGraw-Hill, New York, 1977 and incorporated herein by reference.

Figures 3A, 3B:
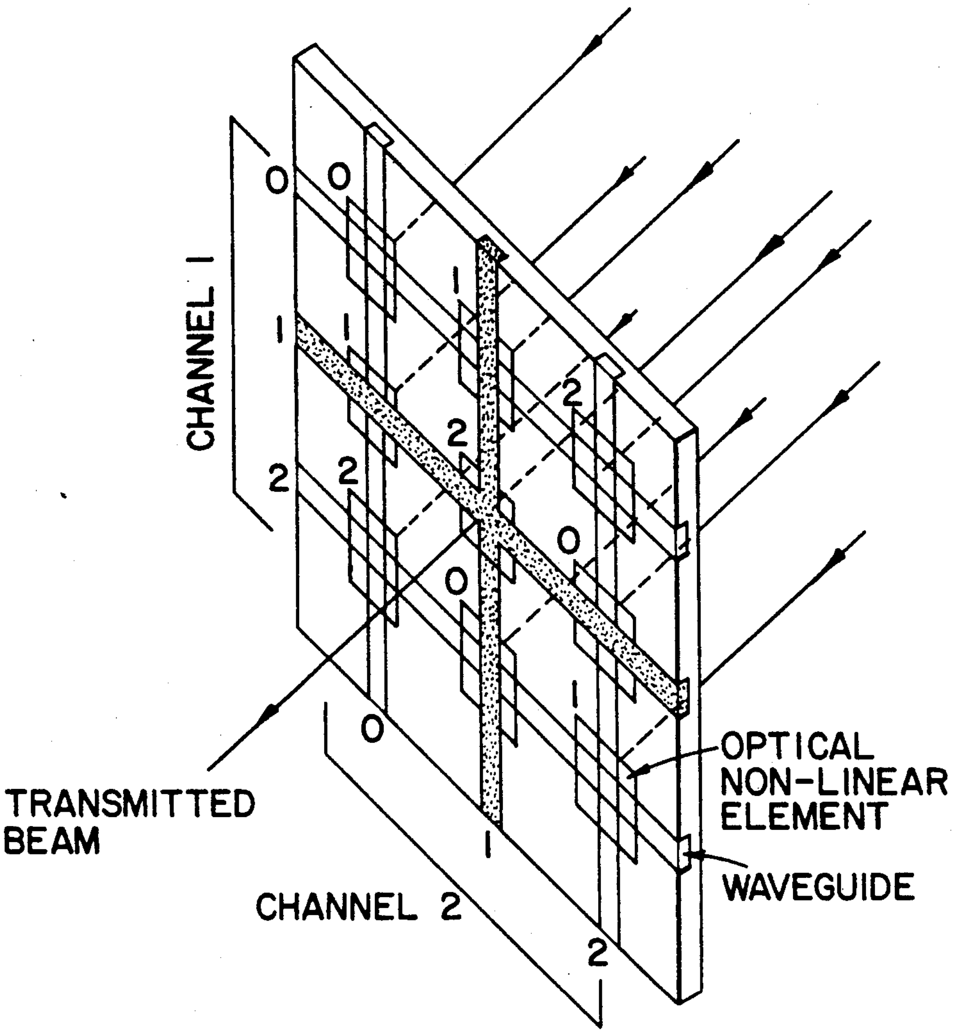
FIGS. 3*a* and 3*b* show an integrated optic residue 3 adder and a truth table for radix 3 residue addition, respectively.

Referring now to FIG. 3a, an integrated optic residue 3 adder using threshold logic is shown. The operation of this residue 3 adder is identical to that of the exclusive-OR gate shown in FIG. 2a. FIG. 3b shows an example of a multi-value logic table, showing a table for radix 3 residue addition. The lack of carry operations is apparent, and this makes parallel processing of residue addition possible.

Figure 4A:
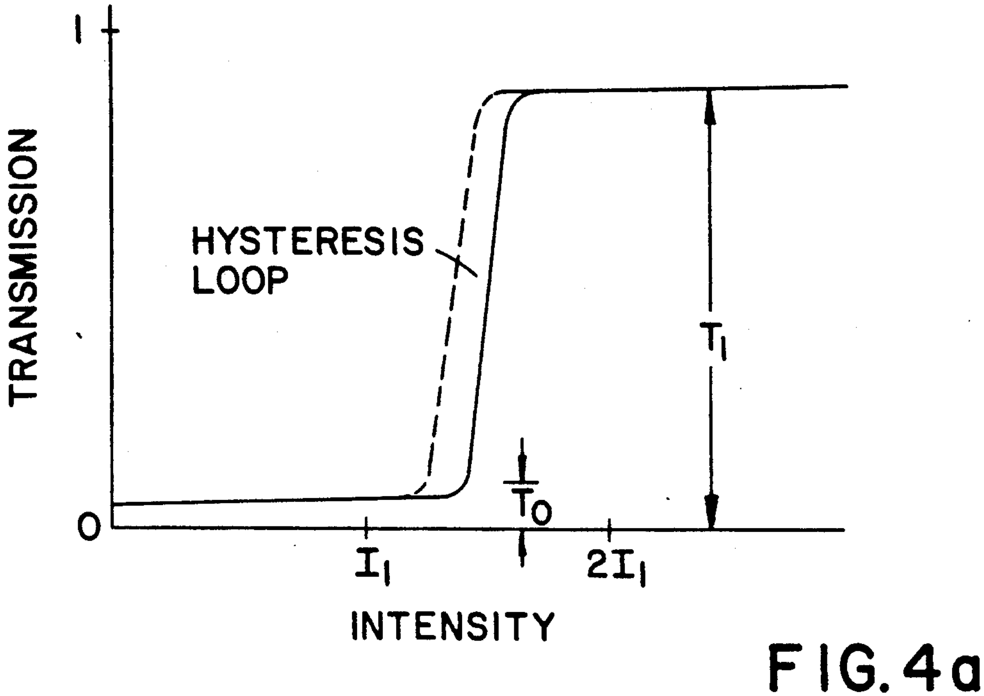
FIGS. 4*a* and 4*b* show switching characteristic properties and a response curve, respectively, for an optical non-linear device.

The desired switching characteristic properties of the optical non-linear devices utilized in the devices of FIGS. 2a and 3a is shown in FIG. 4a. As the light intensity present on the bistable device increases, the transmission value at first stays at a low level, $T_0$. At some higher value of the light intensity, the transmission will switch to a higher value, $T_1$, at which point the bistable device is again fairly independent of light intensity changes. A decrease in the light intensity will reverse the process, except that the switching point may shift slightly due to hysterisis (shown as the dashed line in FIG. 4a). If the unit of light intensity is suitably chosen, ideally one unit will not turn the device on, i.e. switch states, but two units of light intensity will switch the bistable device to the on transmission state. Although optical bistable devices of this kind have been demonstrated, they usually suffer from small on-off ratios. See, for example, the article by Hyatt M. Gibbs, "Controlling Light With Light" in *Optical Bistability*, Academic Press (1985); G. M. Carter et. al., "Intensity-dependent Index of Refraction in Multilayers of Polydiacetylene", *Appl. Phys. Lett.*, 43, (10) pp. 891–893, Nov. 15, 1983; and G. M. Carter et. al., "Intensity Dependent Index of Refraction in Organic Materials", *Optical Engineering*, Vol. 24, No. 4, pp. 609–612, July/Aug., 1985, incorporated herein by reference.

The ratio between $T_1$ and $T_0$ is typically 4. Further the switch point can shift due to environmental effects such as temperature changes. Furthermore, the curve in FIG. 4a is not the fundamental response of the material utilized in the bistable device, but involves a form of optical or opto-electronic feedback which can have a detrimental effect on the overall operation of the device such as reduced switching speed due to the added feedback path length.

Figure 4B:
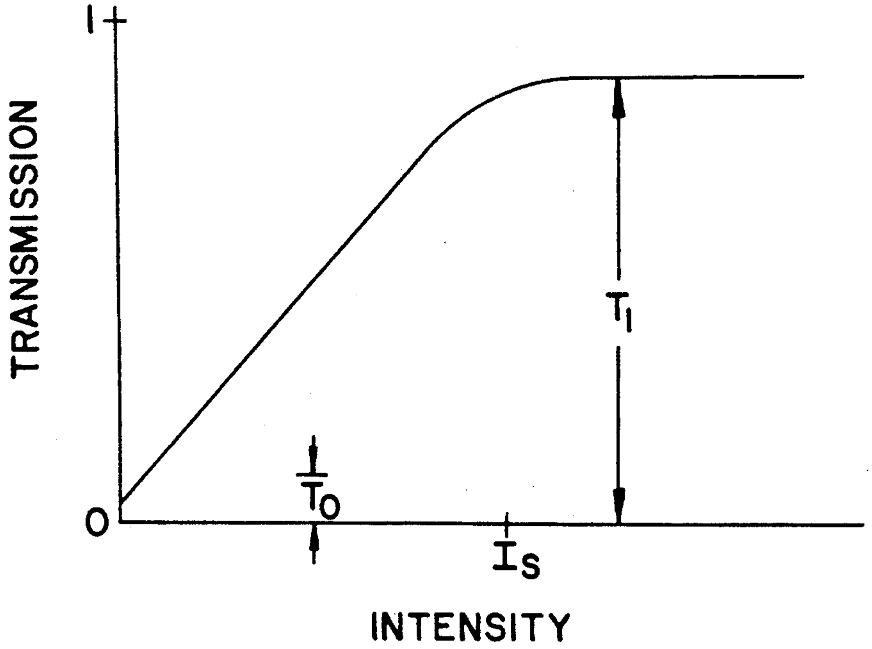

A typical response curve for a non-linear optic material is shown in FIG. 4b. The transmission level starts at $T_0$ for 0 light intensity, and rises linearly with increasing intensity (as the square of the field, thus the term non-linear) and finally saturates to a transmission value $T_1$ after reaching an intensity threshold of $I_s$. Clearly, this response will not perform the required logic operation; however, a pair of such devices placed in tandem will produce the desired response.

Figure 5:
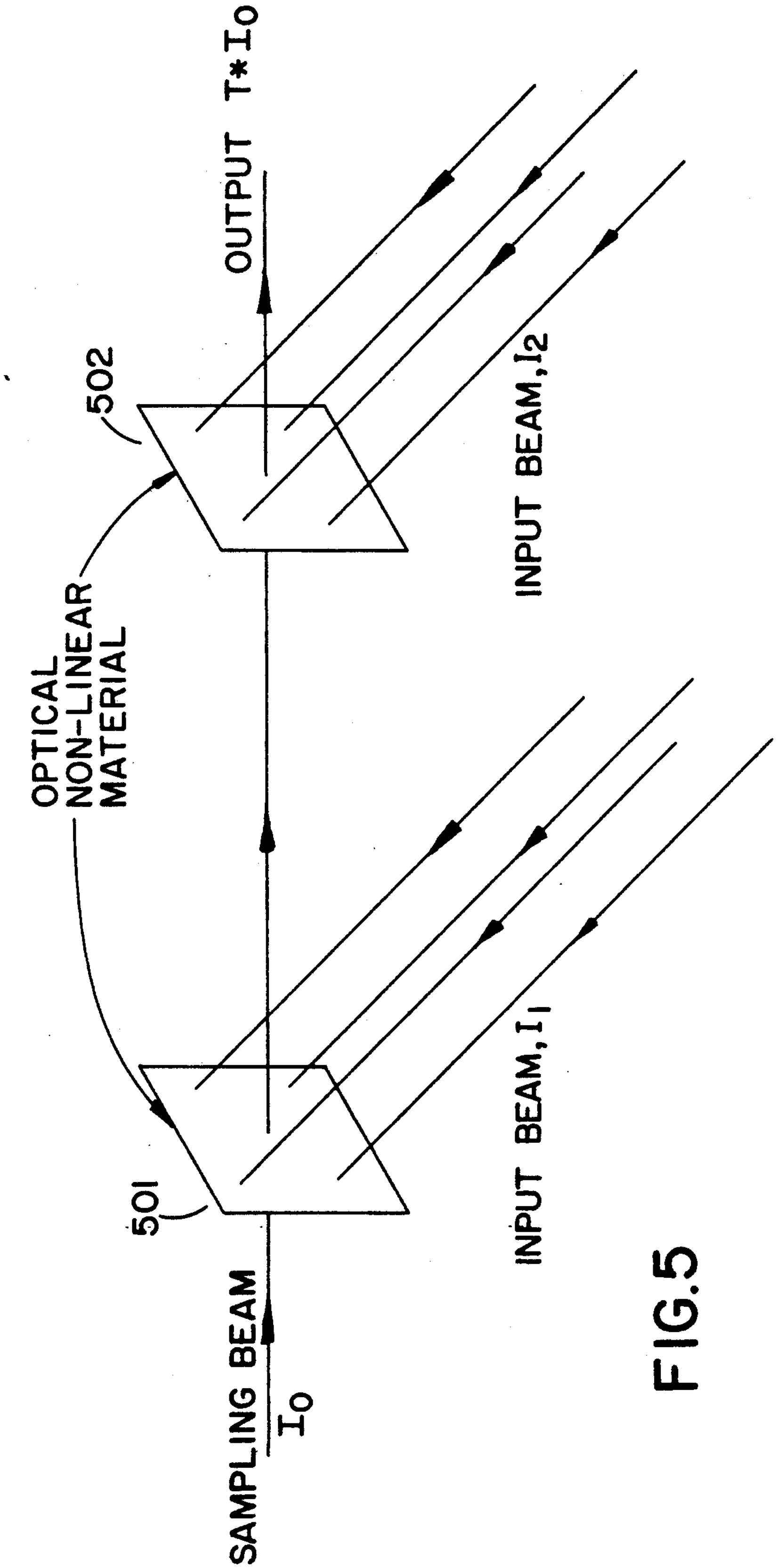
FIG. 5 shows a tandem arrangement of optical non-linear devices in the configuration of a tandem optical AND gate.

The tandem arrangement of the optical non-linear devices in the configuration of a tandem optical AND gate is shown in FIG. 5. Each of the optical non-linear devices can be assumed to have the response curve associated therewith as shown in FIG. 4b. Separate input light beams $I_1$ and $I_2$ are used to illuminate each of the devices 501 and 502, respectively. The input light beams are binary in value, having a lower state with an intensity value of 0 and an upper state with an intensity value of $I_{on}$ which is equal to or greater than the saturation intensity value of $I_s$. In all, there are four possible input states to the tandem arrangement shown in FIG. 5. The inputs are related to the transmission T of the tandem device with respect to the input beams $I_1$ and $I_2$ according to the table below.

| I1 | I2 | T |
|---|---|---|
| O | O | $T_0*T_0$ |
| O | $I_{on}$ | $T_0*T_1$ |
| $I_{on}$ | O | $T_1*T_0$ |
| $I_{on}$ | $I_{on}$ | $T_1*T_1$ |

Given that the values of $T_0*T_0$ and $T_0*T_1$ are much less than the value of $T_1*T_1$, it is clear that the configuration of FIG. 5 functions as an AND gate. In other words, in order for the sample beam to pass through the adjacent optical non-linear devices 501 and 502, both of the input beams $I_1$ and $I_2$ must be of sufficient intensity, i.e. greater than or equal to the saturation intensity $I_s$, so that each device is able to transmit the sample beam. In addition, if $T_0=0.05$ and $T_1=0.9$, then the on-off ratio is equal to 18, which is more than adequate for most digital applications.

Figure 6:
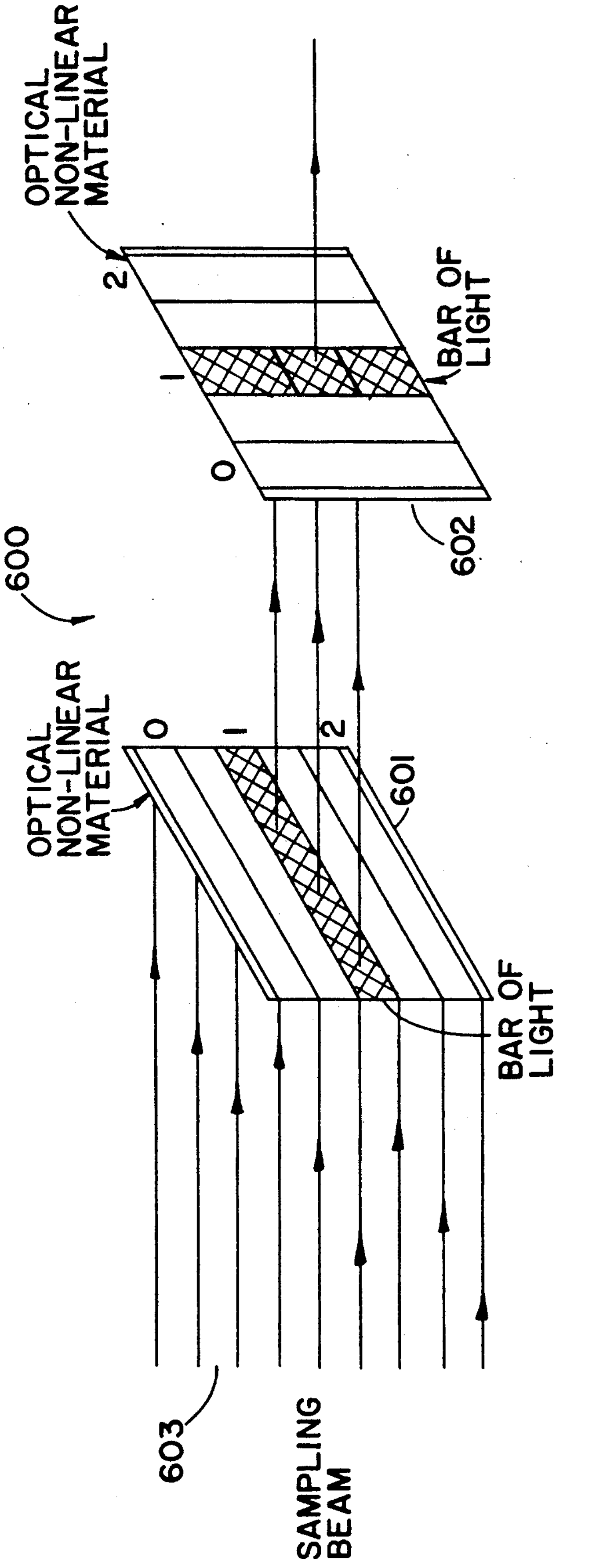
FIG. 6 shows a cross-bar ALU device utilizing the optical AND gate as shown in FIG. 5.

The optical AND gate as shown in FIG. 5 can be utilized as a part of a cross-bar ALU device 600 as shown in FIG. 6. The device is configured with two optical non-linear substrates 601 and 602 being configured directly adjacent to one another in tandem. A light input in the form of vertical bars illuminates the substrate 602 with each bar being the positional representation of an input number for one of the input channels associated therewith.

The second input channel is arranged on the second substrate 601 in a similar fashion, except that the bars are now positioned in a horizontal manner. The sampling beam 603 will only pass through both substrates at the location where the two illuminated bars of the substrates 601 and 602 overlap. Thus, this configuration operates in the same manner as the device shown in FIG. 2 except that a more efficient AND logic operation is utilized in place of the threshold logic used in the device of FIG. 2. The configuration shown in FIG. 6 is expectedly easier to fabricate, due to the elimination of the need for a feedback mechanism, and has a better performance with respect to the on-off ratio switching speed than the devices of FIGS. 1 or 2.

Figure 7:
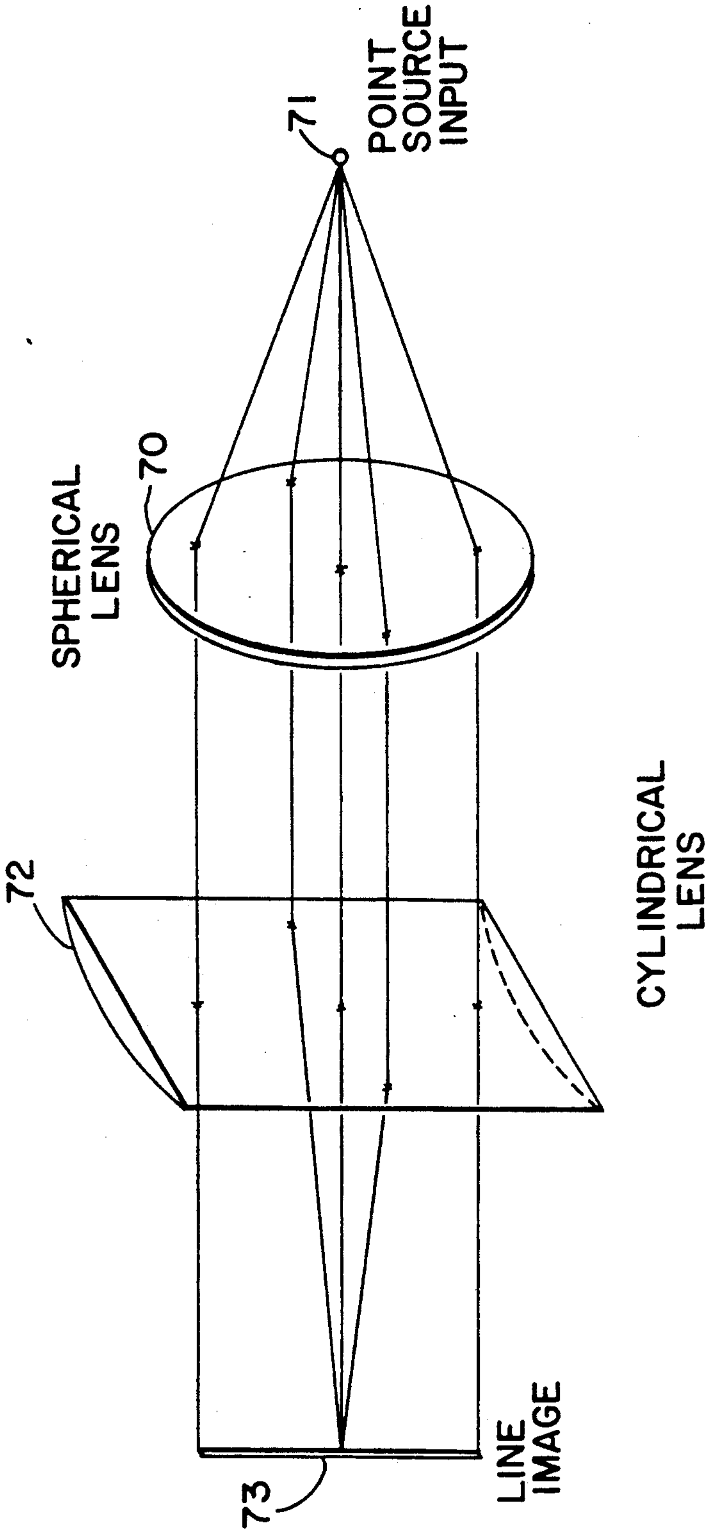
FIG. 7 shows an optical device for forming bars of light which illuminate the optical paths associated with each of the optical substrates.

As was achieved with the previous devices, the bars of light can be physically achieved by several means such as the use of wave guides or with bulk optic techniques shown in FIG. 7 which is described in co-pending application Ser. No. 019,761.

As shown in FIG. 7, a spherical lens 70 in combination with a cylindrical end 72 can be used to convert an input point source 71 (such as an LED, LD, etc.) into a line image of light 73. This line image 73 can be used as one of the cross-bar inputs in a spacial pattern of horizontal and vertical line images transmitted along the optical paths associated with substrates 601 and 602 of FIG. 6.

Figure 8:
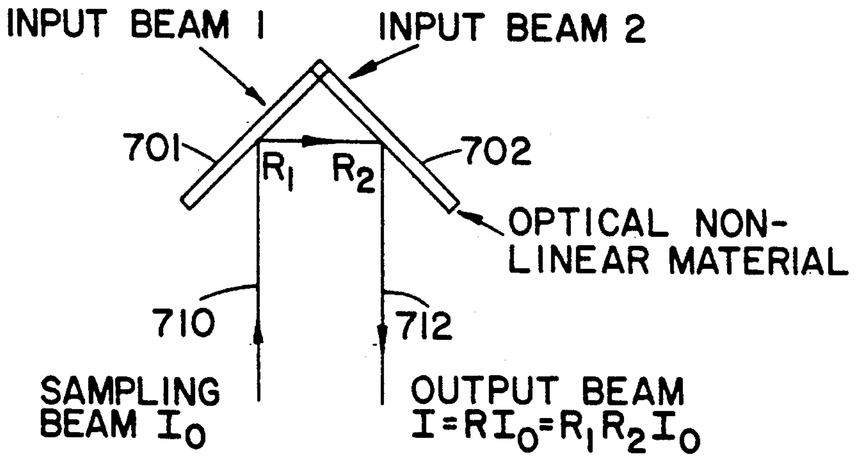
FIG. 8 shows an embodiment of the invention in which reflections are utilized rather than transmissions in forming an optical AND gate.

It should be noted that although the above description of the present invention with respect to the optical non-linear devices is made in terms of transmissions, devices based on reflections would work as well. An embodiment of the invention operable in a reflective mode is illustrated in FIG. 8, and is seen to comprise two plates 701 and 702 of optical non-linear material. The index of refraction characteristics of each plate is controlled by means of the two input beams labeled Input Beam 1 and Input Beam 2 as shown. The sampling beam $I_0$ is input along path 710 reflecting off of plate 701 and then reflecting off of plate 702 and exiting in the form of the output beam along path 712. The output beam intensity, I, is related to the reflectivity $R_1$ and $R_2$ of the plates 701 and 702 respectively by: $I=R_1*R_2*I_0$. In the case of reflections a reflection characteristic curve similar to FIG. 4*b* also results with the ordinate being the reflectivity rather than the transmission characteristic.

Note that in the absence of absorption, reflectance is the complement of transmission. Furthermore, several materials are currently known to have the desire response characteristics shown in FIG. 4*b*. A particular type of material is exemplified by multiquantum well devices made out of III-V semiconductors. The absorption of these devices is shifted via the Frantz-Keldysh and other similar electro-absorption effects. Another class of possible materials is the non-linear organic polymers such as polydiacetylenes. These materials have the ability to change both absorption characteristics and index of refraction which depends on the wave length of the associated light. The latter can be used to cause a change in transmission or reflection through use of standard optical interferometric techniques. In either case, the sampling beam should not cause the non-linear effect to occur in the material. This condition is usually met by arranging for the sampling beam to be of a different polarization or wavelength from the two input beams. Finally, it is important to select a material in which the sampling beam can be of a power that is greater than or equal to the input beam. This requirement is due to the need to be able to drive the next stage of a logic architecture based on these devices.

Although the invention has been described relative to specific embodiments thereof, it is not so limited, in numerous variations and modifications thereof will be readily apparent to those skilled in the art in light of the above teaching. It is therefore to be understood that within the scope of the appended claims the invention may be practiced otherwise than as specifically described.

What is claimed is:

1. An optical apparatus comprising:

a first and second plurality of light sources;

a first optical substrate having a first plurality of optical paths associated therewith, said first optical substrate being operable for transmitting an incident light beam through at least one of said first plurality of optical paths which is illuminated by at least one of said first plurality of light sources; and a second optical substrate located adjacent to said first optical substrate and having a second plurality of optical paths associated therewith, said second optical substrate operable for transmitting a portion of said incident light beam, which has passed through said first optical substrate, through at least one of said second plurality of optical paths which is illuminated by said second plurality of light sources.

2. The apparatus as set forth in claim 1, wherein said first plurality of optical paths traverse said first optical substrate in a horizontal pattern, and said second plurality of optical paths traverse said second optical substrate in a vertical pattern.

3. The apparatus as set forth in claim 2, wherein each one of said plurality of first and second plurality of optical paths is representative of a distinct input value, and wherein said portion of said incident light beam which is transmitted through both said first and second optical substrates is representative of a distinct output value logically or arithematically related to said input values.

4. The apparatus as set forth in claim 2, wherein said incident light beam is only transmitted through both said first and second optical substrates at an intersecting region where said first illuminated optical path overlaps said second illuminated optical path.

5. The apparatus as set forth in claim 1, wherein said first and second plurality of light sources are point sources.

6. The apparatus as set forth in claim 5, further comprising an optical system wherein said point sources are focused through said optical system for forming lines of light and wherein each line of light corresponds to one of said plurality of optical paths.

7. The apparatus as set forth in claim 6, wherein said optical system comprises a spherical lens in combination with a cylindrical lens.

8. The apparatus as set forth in claim 1, wherein said plurality of optical paths comprise wave guides integrated with said first and second optical substrates.

9. The apparatus as set forth in claim 1, wherein said optical paths only transmit said incident light beam upon said light sources illuminating said optical paths at a predetermined threshold of light intensity.

10. An integrated electro-optic arithmetic/logic device comprising:

first and second optical substrates configured adjacent to one another and each having a respective first and second plurality of optical paths formed in a desired pattern thereon, said desired pattern including a plurality of regions where the optical paths associated with said second optical substrate overlap the optical paths associated with said first optical substrate; and a first and second plurality of energizable light sources corresponding in number to the number of said first and second plurality of optical paths, respectively, and wherein energized light sources correspond to inputs of a desired arithmetic or logic operation to be performed, said energized light sources operable for illuminating at least one of said optical paths on each of said first and second optical substrates; wherein said first and second optical substrates transmitting an incident light beam therethrough so as to produce an output, which corresponds to a portion of said incident light beam, at one of the regions, said optical substrates transmitting the incident light beam only through optical paths which have been illuminated by said light sources.

11. The device according to claim 10, wherein said first and second plurality of optical paths are arranged horizontally and vertically, respectively, in order to form an array of said intersecting regions.

12. The device according to claim 10, wherein said plurality of light sources are point sources.

13. The device according to claim 12, further comprising an optical system wherein said point sources are focused through said optical system for forming lines of light and wherein each line of light corresponds to one of said plurality of optical paths.

14. The device according to claim 13, wherein said optical system comprises a spherical lens in combination with a cylindrical lens.

15. The device according to claim 10, wherein said plurality of optical paths comprise wave guides integrated with said first and second optical substrates.

16. The device according to claim 10, wherein said optical paths only transmit said incident light beam in response to said light sources illuminating said optical paths at a predetermined threshold of light intensity.

17. An optical apparatus comprising:

a first substrate having characteristics such that a first portion of a sampling beam is transmitted through said first substrate in response to said first substrate being illuminated by a first light source, and a second substrate having characteristics such that a second portion of said first portion of said sampling beam is transmitted through said second substrate in response to said second substrate being illuminated by a second light source.

* * * * *